PROCESS OF COATING, USING A LIQUID METAL SUBSTRATE HOLDER
Filed April 6, 1966
FIG. 2
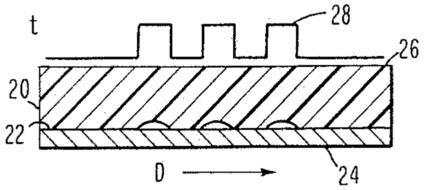
FIG. 1
| SUBSTRATE TYPE | OXYGEN | MEAN DEVIATION(±%) | |
|---|---|---|---|
| SEPARATE SUBSTRATE | YES | 30 | A |
| SEPARATE SUBSTRATE | NO | 10 | B |
| SINGLE SHEET | YES | 6.5 | C |
| SINGLE SHEET | NO | 2.5 | D |
| SINGLE & CLAMPED TO FOIL | YES | 5 | E |
| SINGLE & CLAMPED TO FOIL | NO | 2.5 | F |
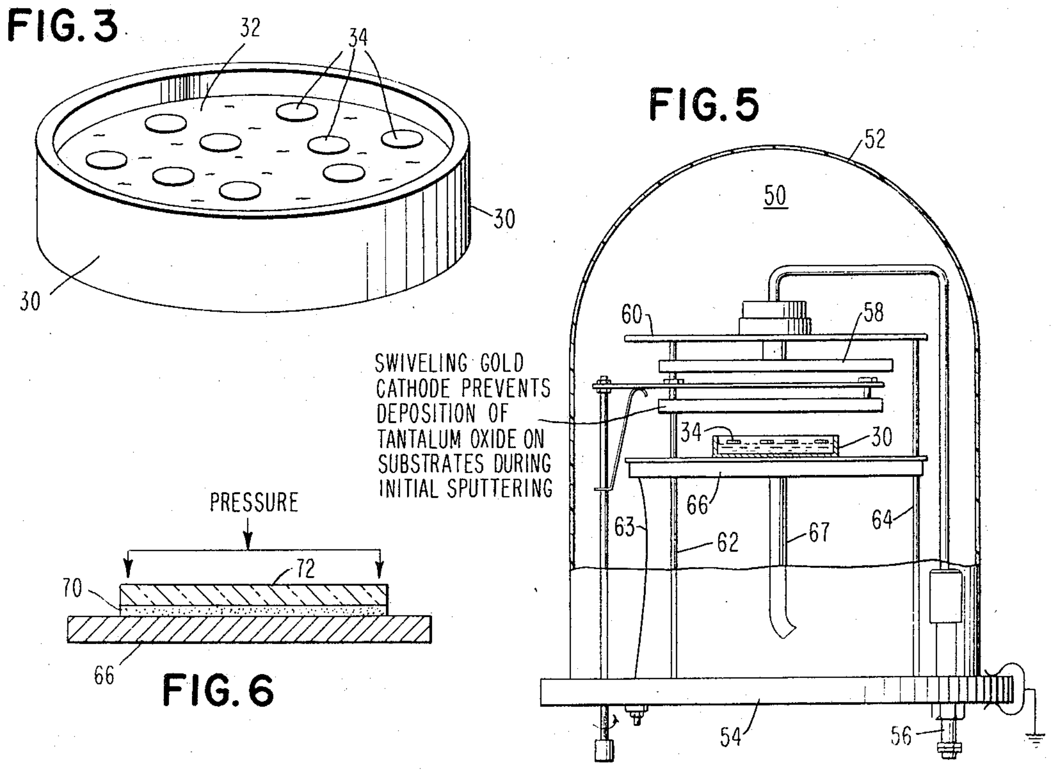
FIG. 3, FIG. 5, FIG. 6
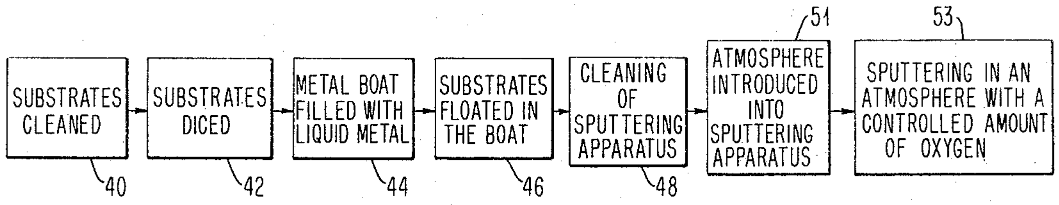
FIG. 4
INVENTOR
LEON I. MAISSEL
BY Joseph C. Redmond Jr.
ATTORNEY United States Patent Office 3,294,661
Patented Dec. 27, 1966

3,294,661
PROCESS OF COATING, USING A LIQUID METAL SUBSTRATE HOLDER

Leon I. Maissel, Poughkeepsie, N.Y., assignor to International Business Machines Corporation, Armonk, N.Y., a corporation of New York Filed Apr. 6, 1966, Ser. No. 541,935
9 Claims. (Cl. 204—192)

This application is a continuation-in-part of copending United States patent application Serial No. 207,289, filed July 3, 1962, now abandoned.

The invention relates to a method and apparatus for manufacturing mircominiaturized components and, more particularly, to a method and apparatus for fabricating thin film components.

Presently, considerable attention has been given to microminiaturization of electronic circuitry for purposes of increasing circuit reliability and lowering circuit costs. A paper entitled "Integrated Thin Film Circuits," by L. Maissel et al., which appeared in the IRE Transaction of the Professional Group on Component Parts, volume CP–8, Number 8, June 1961, describes microminiaturization techniques. One aspect of microminiaturization forms passive circuit elements or components on an insulating member by film depositing techniques. Resistors, capacitors and other components may be constructed from such films deposited on substrates in sheet form. The films are thin in cross section and in principle are highly reproducible by processes suitable for mass production manufacturing. These features permit components to be manufactured with the advantages of low cost, small size, light weight and ruggedness. The components can also be processed along with their interconnection which eliminates the necessity of assembling individual components into a subassembly with the resultant problem of interconnecting the components. Thus, components formed by thin film techniques have the possibility of good reliability and low cost as presently required in electronic circuitry.

A plurality of components, typically 70 mils by 70 mils, are formed in or on a single wafer, typically silicon, ceramic or the like, which is diced into discrete units. Each component, when separated from the wafer, has considerable strength to breakage. The wafer, however, is very fragile and will readily break when clamped in deposition apparatus. Also, the clamped wafer will reduce the area in which components may be established. Hence, it is desirable that wafers be held in deposition apparatus without clamping to eliminate the breakage and increase the yield in devices from the apparatus.

It is known to use grease-like compounds, such as a silicon grease, to hold a substrate to a holder and aid the transfer of heat to/from a substrate during a deposition process. These compounds, however, readily decompose at temperatures in excess of 150° C. The compounds will also decompose at temperatures less than 150° C. if exposed to an ion discharge in the deposition apparatus. The decomposition produces undesirable byproducts which will contaminate the deposited film with resultant undesirable properties. Additionally, for deposited films with precisely controlled properties the thermal conductivity of the grease-like compounds is inadequate and may not allow the required degree of control of the properties of the deposited film. Finally, the grease-like compounds are difficult to remove from the substrate and the solvents necessary to remove the compounds may adversely affect the substrate. It is desirable, therefore, to obtain materials that will retain a substrate to a holder in deposition apparatus which operates at temperatures whereby the material does not decompose, respond to bombardment by low energy ions and can be readily removed from the substrate without damage thereto.

Another factor in fabricating integrated circuits is the reproducibility of passive circuit elements or components to achieve a constant sheet resistivity. It has been noted that, even though the thickness of a thin film sheet is uniform, the sheet resistivity varies in a random fashion. Components produced from such thin films, as a result have widely ranging parameters and only a relatively few in the sheet conform to the tolerances necessary for use in microminiaturized electric circuits. The low yield of circuit elements from the fabrication process increases the element cost to the point that their advantages are outweighed by prohibitive cost. It is desirable, therefore, to improve the reproducibility of thin film, passive elements, especially from a sheet resistivity uniformity standpoint so that their full possibilities may be exploited in data processing apparatus.

A general object of the present invention is an improved process and apparatus for producing microminiaturized circuit components having good reliability and low cost.

One object is a process and apparatus for fabricating thin films with improved reproducibility and better yields of circuit components.

Another object is a process for fabricating thin films having a substantially constant sheet resistivity.

Still another object is a vacuum deposition process and apparatus for fabricating thin films on a substrate so that a substantially zero temperature gradient exists across the substrate.

These and other objects are accomplished in accordance with the present invention one illustrative embodiment of which comprises the steps of suitably cleaning an insulating member which serves as a film depositing surface, filling a boat or container with a liquefiable metal, typically gallium, dicing the insulating members into a plurality of sections, placing the plurality of sections in the boat so that they float in the metal, depositing the boat in a vacuum deposition apparatus having a preselected atmosphere with a controlled amount of oxygen so the boat is at a reference potential and a cathode terminal connected to a high voltage supply is positioned directly above the boat to provide a supply of metal atoms which are collected by the sections in the boat, the metal liquid providing a constant vertical thermal gradient and a zero horizontal temperature, gradient across each section so that the deposited metal film is uniform in thickness and constant in resistivity.

One feature of the present invention is maintaining a zero temperature gradient across a substrate during a thin film depositing process so that the resultant film will have a constant sheet resistivity.

Another feature is floating a plurality of substrates in a liquid metal so that an infinite number of contact points exists between each section and the liquid metal thereby providing uniform and equal heat dissipation from each section during a vacuum deposition process.

Another feature is a sputtering process having a preselected atmosphere with a controlled amount of oxygen so that the resistivity of a deposited film will be substantially constant and not subject to change with time due to oxidation.

Still another feature is employing a high thermal conductive ceramic as a substrate in a vacuum deposition process so that the temperature gradient along the surface of the substrate will be uniform and the resultant metal film will have a substantially constant sheet resistivity.

The foregoing and other objects, features and advantages of the invention will be apparent from the following more particular description of the preferred embodiment of the invention as illustrated in the accompanying drawing.

FIGURE 1 is a tabulation indicating the sheet resistivity of various substrates during a vacuum deposition process.

FIGURE 2 is a cross sectional view of a substrate showing the temperature gradient that exists across a typical substrate during a vacuum deposition process.

FIGURE 3 is an isometric view of one embodiment of an apparatus for obtaining a constant vertical and a substantially zero temperature gradient of a plurality of substrates during a vacuum deposition process.

FIGURE 4 is a flow chart illustrating a preferred embodiment of the invention.

FIGURE 5 is a side view of vacuum deposition apparatus including the embodiment of FIGURE 3 for depositing a thin film on the substrates.

FIGURE 6 is a cross sectional view of another embodiment of a substrate for obtaining a constant vertical and a substantially zero horizontal temperature gradient during a vacuum deposition process.

Referring to FIGURE 1, it has been discovered that the resistivity of vacuum deposited or sputtered thin films, typically tantalum, is especially sensitive to the presence of oxygen in the atmospheric environment in which the sputtering occurs. Rows A and B of FIGURE 1 compare the deviations in resistivity of thin films for corresponding pluralities of substrates which were tantalum sputtered to the same thickness. The material of the substrate is one of several glasses that are suitable for withstanding a high temperature as well as being able to provide a highly polished surface. The resistivity across each substrate was measured with suitable laboratory instruments. Row A indicates the average deviation of the substrates from the mean resistivity was approximately 30% when the substrates were sputtered in an argon atmosphere containing approximately 0.1% oxygen. In contrast, sputtering of corresponding substrates in a substantially pure argon atmisphere resulted in a resistivity deviation of 10% across the substrates. One possible explanation for the difference in resistivity deviations between rows A and B of FIGURE 1 is that the oxygen in the atmosphere results in the formation of a tantalum oxide whose rate of formation is especially temperature sensitive. The resistivity deviations of the tantalum oxide will vary widely according to the oxygen present in the sputtering atmosphere. Such a theory appears to be explainable in terms of rows C and D when compared to rows A and B.

Rows C and D indicate resistivity deviations for single sheet substrates having sputtered tantalum film thereon instead of a plurality of individual substrates having sputtered tantalum films thereon, as in the case of rows A and B. It is believed readily apparent that the temperature variation across a single sheet substrate is less than that across a plurality of individual substrates. Thus, even though oxygen is present in the sputtering atmosphere, the temperature gradient in the case of a single sheet substrate should be less than that for a plurality of individual substrates. The comparison of resistivity deviations for rows A and B and rows C and D appear to verify this conjecture.

Rows E and F of FIGURE 1 disclose resistivity deviations for substrates individually clad on one side with a metal foil when placed in a sputtering atmosphere having the presence and absence of oxygen. It will be noted that the resistivity deviations of rows E and F are less than those for rows C and D as well as rows A and B. The reduced resistivity appears to be explainable by the fact that the metal foil clamped to the substrate serves as an efficient heat transfer medium to maintain a substantially zero temperature gradient across the surface of the substrate. Since the temperature gradient along the surface of the substrate is substantially zero, the sputtered metal will be deposited all along the substrate surface under substantially the same conditions so that the resistivity deviations will be minimized. In the case of row E, the oxygen in the atmosphere will cause higher resistivity deviations, but these deviations are nowhere near those which occurred in rows A through D. These discoveries, therefore, indicate that good yields of microminiaturized components may be obtained from vacuum deposition processes when the substrate temperature gradient parallel to the surface is substantially zero and oxygen is eliminated from the sputtering atmosphere.

It has been further discovered, however, that the complete elimination of oxygen from a sputtering atmosphere is not preferred in fabricating thin film components. A tantalum film produced by a sputtering process, lacking oxygen, will subsequently oxidize with resultant changes in the resistivity of the film. Thin film components made under such conditions will have a variable resistivity as long as the oxidation process continues. Ultimately, the oxidation process stabilizes and the resistivity remains constant. Consequently, the fabrication of thin films under such a process requires an aging period to stabilize the resistivity parameters. Sputtering tantalum films in an atmosphere containing a controlled amount of oxygen, however, enables most of the oxidation to take place during fabrication so that the resistivity stabilization or aging period is minimized in the fabrication process. It is important, however, that the thermal temperature gradient along the surface of the substrate be substantially zero during such a sputtering operation, otherwise serious resistivity deviations along the substrate will occur for reasons previously described.

The thermal gradient along the surface of a substrate is dependent, in part at least, upon the number of contact points between the heat radiator and the substrate. Referring to FIGURE 2, a substrate 20 has a surface 22 which is irregular in configuration. Consequently, a rigid substrate support 24 will provide a discrete number of contact points. Thermal energy supplied to such a substrate will tend to flow through these contact points and be stored in the intervals between the contact points. Along surface 26 of the substrate a thermal gradient 28 will appear, as indicated in FIGURE 2. The non-uniformity of the thermal gradient will produce variations in resistivity of the sputtered film especially when performed in an atmospheric environment including a percentage of oxygen. It is desirable, therefore, to increase the number of contact points between the heat transfer medium engaging a substrate so that the thermal gradient along the surface of the substrate will be substantially zero. Sputtered films fabricated in accordance with these conditions will have minimum resistivity deviation so that a relatively good yield of components will occur with a minimum requirement for aging to produce stabilization of the component resistivity.

One apparatus for obtaining a substantially zero horizontal temperature gradient across a substrate is indicated in FIGURE 3 and includes a metal boat 30 which contains an easily liquefiable metal 32 in which one or more substrates 34 are floated. Although a boat 30 has been shown, the metal may also be applied as a thin film on a holder or platform 66 of deposition apparatus (see FIGURE 5). The substrates may be silicon, germanium, glass, ceramic, semiconductor components and oxidized semiconductors. The substrate, preferably, should be heated to a temperature exceeding 150° C. for improved properties of deposited films. A number of liquefiable metals may be employed in the invention. Among the metals found to be practical are gallium, indium, bismuth, lead, tin and their alloys. The liquefiable metals should have a low vapor pressure and a low melting temperature to be effective.

The vapor pressure at operation temperature should be in the range from 0 to about $10^{-9}$ torr (1 millimeter of Hg pressure; see Scientific Foundation of Vacuum Technique, by S. Dushman and J. M. Lafferty, John Wiley & Sons, Inc., 1962, Second Edition, page 4). Vapor pressures in excess of $10^{-9}$ torr will cause contamination of the deposited film and adversely affect the properties thereof. The material temperature should be in the range from room temperature to 650° C.; otherwise the vapor pressure will exceed $10^{-9}$ torr.

Gallium, in particular, has several advantages when employed in a sputtering process. The gallium covers the surface of each substrate so that an infinite number of contact points exists between opposite sides of the substrates. Accordingly, thermal energy supplied to the substrates will be uniformly removed so that a substantially zero temperature gradient will exist across the surface of the substrates. Gallium is easily liquefiable and is denser than most commonly used substrate materials. Consequently, the substrates can be made to float in the liquid with a surface exposed above the liquid for the deposit of metal films. Gallium is also a good heat exchange medium so that the thermal energy developed in the sputtering process may be rapidly transmitted to the external atmosphere through a suitable cooling device. Gallium has been selected as a preferred embodiment for the present invention solely for reasons of description.

A general process for fabricating microminiaturized components will next be described in connection with FIGURES 4 and 5. FIGURE 4 describes the steps in the process of fabricating the components and FIGURE 5 describes the apparatus employed in the process. Referring to FIGURE 4, the first step in the process involves cleaning 40 a substrate by suitable means such as ultrasonic techniques or cleaning compounds which are well known to those skilled in the art. The cleaning places the surfaces of the substrate in suitable condition to accept a deposited metal on one side and to transmit thermal energy through the other side by an infinite number of contact points with a suitable liquid metal. The substrates may be in the form of a single sheet or a sheet that has been diced into a plurality of individual elements. Since dicing of a substrate after deposition of a metal film is wasteful of the deposited metal, it is preferred, but not required, that the substrate be diced 42 prior to the deposition of the metal. The dicing may be performed by ultrasonic cutting tools after a pattern has been indicated on the sheet.

The boat 30 (see FIGURE 3) is filled 44 to a predetermined depth with gallium and the diced substrate elements are placed so that they float 46 with a surface above the metal. Thereafter, the boat is placed in a vacuum deposition apparatus 50 indicated in FIGURE 5 for depositing a metal or insulating film on the exposed surfaces of the substrate elements. The insulating film may be silicon dioxide, silicon nitride, glasses, ferrites, titanates, organic compositon, e.g. Teflon. The metal selected for deposit on the substrate may be any one of several that are known in the art as indicated in an article entitled "Temperature Coefficients of Resistance of Metallic Films in the Temperature Range 25° to 600° C.," by R. B. Belser and W. H. Hicklin, Journal of Applied Physics, volume 30, pp. 313, 322, March 1959. Also copper, silver, aluminum and other conductive metal may be practiced. A preferred metal for depositing thin films is tantalum because it shows no tendency to anneal at normal temperatures. In the case of tantalum, it has been discovered that for temperatures less than 500° C. the substrate temperature will have little or no effect upon the grain size of the metal deposited on the substrate. This feature is of particular importance since, as previously indicated, the resistivity of the deposited film will vary if a temperature gradient exists in the sputtering process. Advantageously, sputtering of tantalum can be performed at temperatures less than 500° C. so that the selection of the metal further aids the fabrication of microminiaturized components.

The vacuum deposition apparatus shown in FIGURE 5 includes a bell jar 52 suitably mounted on a base plate 54 through which an electrode terminal 56 extends to connect to a cathode terminal 58. The terminal 56 provides a high voltage negative potential of the order of 3000 volts. As a result, electrons are released from the metal 58 due to the repulsion of the high voltage terminal. A shield 60 is suitably positioned on stanchions 62 and 64 which are secured to the base plate. The shield insures that the electrons are directed in a single direction, namely, toward the boat 30. The stanchions also include a platform 66 on which the boat 30 is positioned. The platform is connected through lead 63 to a reference potential, typically ground. The platform also includes cooling coils (not shown) for removing the heat developed during the sputtering process. The heat is removed through a piping system 67 connected to an external heat exchanger (not shown). The platform is positioned approximately 3" below the cathode which is directly above the boat 30.

Returning to FIGURE 4, the bell jar is evacuated through a suitable opening (not shown) included in the base plate 54. Prior to filling the jar with an atmosphere, the apparatus included therein is inspected and cleaned 48 to prevent outgassing of any material that would influence the sputtering process. All dirt, grease and other matter which could evaporate during the sputtering process are removed in a clean room so that the final apparatus for sputtering is substantially oxygen free. An argon atmosphere 51 of the order of 50 microns and containing a controlled amount of oxygen, typically of the order of 0.1% relative to the argon atmosphere, is introduced into the bell jar. The atmosphere pressure may vary from 10 microns to 200 microns, but 50 microns have been found to provide the best rate of material deposit. The oxygen permits a controlled oxidation of the deposited metal films to occur so as to minimize any aging to stabilize the resistivity of the deposited metal.

Thereafter, a high voltage supply is connected to the terminal 56 and the sputtering process 53 begins. A current of 1 milliampere/square centimeter of the cathode is employed to deposit the metal on the substrate. The negative voltage supplied to the cathode causes electrons to be emitted from the tantalum plate 58. The electrons strike the argon atoms and establish an avalanche process whereby positive argon ions and additional negative electrons are created. The positive argon ions are attracted to the negative plate. The ions strike the plate 58 and knock out tantalum atoms which settle on the substrates to form a thin metallic film. The argon atoms also strike the substrates and a portion of their momentumu is converted into heat which is transmitted through the substrate to the gallium liquid. The cooling coils included in the platform 66 pick up the heat received by the gallium and carry the heat away to the external heat exchanger (not shown). The process continues until a film of preselected sheet resistivity is deposited on the surface of the substrates. Normally, a sputtering process based on the indicated pressures and temperatures will provide metal deposit rates of 16 Angstroms/second. The sputtering is allowed to proceed until a film of the order of 500 Angstroms in thickness is deposited on the substrates. The gallium liquid maintains a substantially zero temperature gradient across the substrates so that the resistivity thereof is substantially constant for the reasons previously indicated. After the process has been completed, the voltage source is disconnected from the terminal 56 and the boat removed from the vacuum deposition apparatus. The substrates are cleaned and inspected. Resistivity tests performed by suitable laboratory instruments will produce data of the order in rows D and E of FIGURE 1.

The following examples are given as suitable for depositing various films on various substrates. These methods, however, are not to be taken as limitive of the invention, other source materials, liquefiable metals and substrate material being equally applicable to the practice of the invention.

*Example 1*

Silicon dioxide was deposited on a silicon substrate by first cleaning the substrate ultrasonically in a detergent. The substrate was subjected to a vapor degreasor, typically isopropyl. Pure gallium was wiped across the holder 66 of the apparatus shown in FIGURE 5. The holder was either molybdenum or stainless steel. The gallium formed a film which served as an efficient heat transfer medium. The silicon substrate was placed on the holder and a silicon dioxide electrode was placed at the cathode of the apparatus shown in FIGURE 5. The apparatus was modified slightly to permit radio-frequency sputtering as described in a previously filed application, Serial No. 428,733, filed January 28, 1965 and assigned to the same assignee as that of the present invention. The apparatus was pumped down to a vacuum of approximately $10^{-5}$ torr or better. The temperature of the holder was raised to approximately 250° C. The chamber 52 was charged with pure argon to a pressure of the order of 10 microns. An RF supply was connected to the silicon dioxide electrode and sputtering commenced. The temperature of the holder was maintained at 250° C. Depending upon the RF power applied to the cathode, the temperature control involved the application of heat or cooling to the holder to maintain the 250° C. Sputtering was conducted at a deposition rate of about 750 Angstroms per minute. The sputtering was continued until the film of desired thickness was obtained on the substrate. The RF supply was disconnected from the cathode to terminate the sputtering. The holder was cooled to reduce the substrate temperature to near room temperature.

*Example 2*

Silicon dioxide was deposited on a silicon substrate where the liquefiable metal was a lead/tin alloy (80/20) having a melting temperature of about 190° C. The process for depositing the silicon dioxide on the substrate was the same as that described for Example 1, except the holder had to be copper to permit the lead/tin to wet the surface thereof. The lead/tin was placed on holders in solid form. The silicon substrate was deposited on the lead/tin. When the temperature in the apparatus was raised to 250° C., the lead/tin melted and formed a thin film which wetted the surface of the holder and the substrate.

*Example 3*

A chromium film was deposited on an oxidized silicon wafer in a conventional evaporating apparatus as well as in sputtering apparatus of the type shown in FIGURE 5. The oxidized silicon wafer was cleaned ultrasonically in a detergent and vapor degressed in isopropyl alcohol. Pure gallium was wiped across the holder which was molybdenum or stainless steel to form a film thereon. A tungsten boat was placed in the evaporating apparatus and a charge of chromium pellets, typically 250 mgr., was loaded therein. The apparatus was pumped down to $10^{-5}$ torr and the holder temperature raised to about 200° C. A shutter was inserted between the source and substrate to prevent contamination of the latter. Approximately several hundred amperes were passed through the boat to raise the temperature of the chromium to the point where evaporation took place at an accepted rate. The shutter was removed to permit deposition of the chromium on the substrate. A quartz crystal oscillator detected the film deposition rate. Deposition occurred at a rate of about 300 Angstroms per minute. When the desired film thickness was realized, the shutter was inserted to terminate the deposition on the substrate. The current to the boat was terminated and the substrate holder cooled to bring the substrate to room temperature.

Another technique for providing an efficient heat transfer medium for a substrate is indicated in FIGURE 6. A soft metal foil 70 is placed between a substrate 72 and the substrate support 66. The substrate is squeezed against the foil by suitable means so that the soft metal will flow and duplicate the effect of the liquid described in the previous example. One metal found satisfactory for this process is indium, when subjected to moderate pressures. Any ductile metal, i.e., gold, lead, however, is satisfactory for such a process. Substrates constructed in this manner when placed in the vacuum deposition apparatus of FIGURE 5 will have a substantially zero temperature gradient thereacross during a sputtering process. Hence, the resistivity of deposited films on such substrates will be substantially constant.

Still another procedure for providing substrates with zero temperature gradients is to employ a ceramic having a high thermal conductivity. Such materials transmit substantially all thermal energy received so that a nearly zero temperature gradient exists along the surface to which metal may be deposited. One ceramic found to have such qualities is alumina.

Thus, it is believed apparent that an efficient heat transfer may be suitably brought into contact with a substrate in multitude of different arrangements so that an infinite number of contact points exists between the medium and the subsrate. Also, the thermal energy received by a substrate can be released by the substrate per se as indicated by the high thermal conductive ceramic. It is believed, therefore, that the present invention should not be limited to the particular thermal dissipating means described herein. The present arrangements were selected solely for reasons of convenience in explanation.

Thus, the present invention has provided a process and apparatus for fabricating thin films which may be employed in microminiaturized components, for example, resistors and capacitors. The resistivity deviations of components fabricated in the manner disclosed in the present process is substantially constant when the steps of the process are faithfully executed. The components fabricated have a relatively high yield so that the features of microminiaturized circuitry, namely reliability and low cost, can be obtained without the disadvantages previously found in the prior art. A controlled amount of oxygen in a sputtering atmosphere and the complete dissipation of thermal energy received by a substrate provide the desired results of constant resistivity, uniform thickness and high yields of components for microminiaturized circuitry.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method for fabricating microminiaturized circuit elements which comprises the steps of placing a substrate on a liquid metal film on a holder in a chamber, the liquid metal having a vapor pressure in the range from 0 to about $10^{-9}$ torr and a melting temperature from room temperature to about 650° C.

providing a low pressure atmosphere within the chamber, providing in the chamber a first electrode having a material suitable for deposition on the substrate, providing a second electrode within said chamber, and providing heat exchanging means to exchange heat uniformly from said liquid metal whereby the horizontal temperature gradient across said circuit element is substantially zero, applying an electric potential between the first and second electrodes to sputter the materials and form a thin film on the substrate.

2. The process of claim 1 further including the step of regulating the substrate temperature to be in excess of 150° C. during vaporization of the material.

3. The process of claim 2 further including the step of cooling the holder to permit a uniform thickness of material to be deposited on the substrate.

4. The process of claim 3 wherein the liquid metal has a low vapor pressure and a low melting temperature.

5. The process of claim 1 wherein the liquid metal is taken from the group consisting of gallium, indium, bismuth, lead, tin and their alloys.

6. The process of claim 5 wherein material sputtered from the first electrode is an insulator.

7. The process of claim 5 wherein the first electrode material is a metal.

8. The process of claim 3 further including the steps of charging the chamber with an inert atmosphere including a controlled amount of oxygen.

9. The process of claim 8 wherein the material is a metal and the grain size during deposition is not affected by the substrate temperature and has substantially no tendency to anneal.

References Cited by the Examiner

UNITED STATES PATENTS

| | | | |
|---|---|---|---|
| 2,522,531 | 9/1950 | Mochel | 117—211 |
| 3,235,476 | 2/1966 | Boyd et al. | 204—192 |

JOHN H. MACK, *Primary Examiner.*

R. MIHALEK, *Assistant Examiner.*